(12) United States Patent
Chen

(10) Patent No.: US 6,438,637 B1
(45) Date of Patent: Aug. 20, 2002

(54) DUAL SOLDER-HOLE LAYOUT FOR EXPANSION SLOTS

(75) Inventor: Yu-Guang Chen, Taichung (TW)

(73) Assignee: Austek Computer Inc., Taipei (TW)

( * ) Notice: Subject to any disclaimer, the term of this patent is extended or adjusted under 35 U.S.C. 154(b) by 0 days.

(21) Appl. No.: 09/417,394

(22) Filed: Oct. 13, 1999

(30) Foreign Application Priority Data

Nov. 9, 1998 (TW) ........................................ 87218559 U

(51) Int. Cl.[7] ............................ G06F 13/00; H05K 7/10; B23K 31/02
(52) U.S. Cl. ..................... 710/301; 710/305; 29/829; 361/760; 439/55
(58) Field of Search ............................. 710/301, 305, 710/300; 29/829; 361/760, 772, 807; 439/55; 174/138 E

(56) References Cited

U.S. PATENT DOCUMENTS 5,255,159 A * 10/1993 Seyk
5,852,725 A * 12/1998 Yen
6,351,719 B1 * 2/2002 Harenza et al.

* cited by examiner

Primary Examiner—Gopal C. Ray
(74) Attorney, Agent, or Firm—J.C. Patents

(57) ABSTRACT

A dual solder-hole layout for expansion slots is disclosed. The dual solder-hole layout, which comprises a first solder-hole layout and a second solder-hole layout, can be electrically connected to one of various types of expansion slots. The first solder-hole layout comprises a first solder-hole row and a second solder-hole row. Solder holes in the first solder-hole row form a straight line. The second solder-hole row is separated into a first solder-hole portion and a second solder-hole portion. The first solder-hole portion of the second solder-hole row is parallel to the first solder-hole row but far from the first solder-hole row. The second solder-hole portion of the second solder-hole row is also parallel to the first solder-hole row and is closer to the first solder-hole row. The second solder-hole layout comprises a third solder-hole row. The third solder-hole row is parallel to the first solder-hole row and the first solder-hole portion of the second solder-hole row. The use of the dual solder-hole layout on a circuit board can solve the problem of insufficient space on the circuit board and increase the compatibility for the circuit board to electrically connect to various expansion equipment.

13 Claims, 4 Drawing Sheets

DUAL SOLDER-HOLE LAYOUT FOR EXPANSION SLOTS

CROSS-REFERENCE TO RELATED APPLICATION

This application claims the priority benefit of Taiwan application serial no. 87218559, filed Nov. 9, 1998, the full disclosure of which is incorporated herein by reference.

BACKGROUND OF THE INVENTION

1. Field of Invention

The present invention generally relates to a solder-hole layout for expansion slots on a circuit board, and more particularly to a solder-hole layout that can be electrically connected to one of various types of expansion slots on a circuit board.

2. Description of Related Art

An industrial standard adapter (ISA) slot has been used as an interfacing standard for personal computers for quite a long time. Due to its low access speed, it has gradually become obsolete. On the other hand, peripheral component interconnect (PCI) slots as well as other expansion slots are becoming more and more popular because of their advantages over the ISA slot. However, the demand for the ISA slot as a connection to some expansion equipment still exists in the industry. Therefore, the ISA slots are still required in practice. Unfortunately, the demand for the ISA slots varies depending on actual requirements. As a result, various types of expansion slots, including the ISA slots, in different quantities need to be built on circuit boards during the transition period to meet users' requirements.

FIG. 1 is a portion of a motherboard showing a conventional solder-hole layout for expansion slots. There are two solder-hole layouts 12 and 14 for ISA slots, and one solder-hole layout 10 for a PCI slot. Since customers might require different types of expansion slots in different quantities, the manufacturer therefore needs to provide a motherboard with one ISA slot and two PCI slots or other combinations. Therefore, various products need to be designed and manufactured, and consequently extra stocks need to be carried. Also, development costs and time as well as the effort to manage the stock level are inevitably increased.

To meet users' requirements for various types of expansion slots in different quantities, a motherboard accommodating various types of expansion slots needs to be built. Unfortunately, the number of connector ports on the chassis of a computer is limited. The relative positions of the connector ports are also fixed. It is unlikely that an unlimited number of expansion slots would be built on the motherboard.

A more practical way to solve the above-mentioned problem is to design a solder-hole layout on the motherboard, which solder-hole layout can be shared by the ISA and PCI slots. By doing so, the motherboard becomes compatible with different types of interfacing cards. Consequently, the developing costs can be reduced and the problem of stock management can be overcome. FIG. 2 is a portion of a circuit board showing a solder-hole layout for expansion slots, which causes a conflict because of the overlapping of solder holes in two different solder-hole layouts. As shown in FIG. 2, there is a solder-hole layout 30 for an ISA slot and a solder-hole layout 40 for a PCI slot. However, the chassis has only a limited number of connector ports with fixed positions through which expansion equipment can connect to the interfacing cards on the motherboard. It is necessary to align the interfacing cards to the connector ports on the chassis so that expansion equipment can be correctly connected to the interfacing cards. It is then difficult to put together the solder-hole layout 30 for the ISA slot and the solder-hole layout 40 for the PCI slot without conflicts because solder holes in a solder-hole row 34 of the solder-hole layout 30 overlap with those of a solder-hole row 42 of the solder-hole layout 40. It is then difficult for different types of expansion slots to share the same circuit board. As a result, different circuit boards need to be designed and manufactured for various combinations of different types of expansion slots required.

As a summary, the conventional solder-hole layout for expansion slots on a circuit board has the following disadvantages:

1. The chassis has only a limited number of connector ports with fixed positions through which expansion equipment can connect to the interfacing cards on the circuit board. It is necessary to align the interfacing cards to the connector ports on the chassis so that expansion equipment can be connected to the interfacing cards. Therefore, types and quantities of expansion slots which can be built on a circuit board are heavily constrained. Extra developing effort and manufacturing costs to design the circuit board layouts are required.
2. It becomes unavoidable to have at least two circuit board designs for every product developed during the transition period, which causes extra developing time and costs. This significantly prevents the products from being quickly and smoothly introduced into the market. Extra costs for stock management are also incurred.

SUMMARY OF THE INVENTION

It is therefore an objective of the present invention to provide a dual solder-hole layout for expansion slots, in which a plurality of solder holes are arranged in a specific way. One of the various types of expansion slots can be electrically connected to the dual solder-hole layout, which comprises a first solder-hole layout (70) and a second solder-hole layout (80). The first solder-hole layout (70) comprises a first solder-hole row (72) and a second solder-hole row (74). The second solder-hole layout (80) comprises a third solder-hole row (82) that is parallel to the first solder-hole row (72). Solder holes in the first solder-hole row form a straight line. The second solder-hole row (74) is separated into a first solder-hole portion (74a) and a second solder-hole portion (74b). The first solder-hole portion (74a) of the second solder-hole row (74) is closer and parallel to the first solder-hole row (72). The second solder-hole portion (74b) of the second solder-hole row (74) is also parallel to the first solder-hole row (72) but far from the first solder-hole row (72). The third solder-hole row (82) is parallel to the first solder-hole row (72) and the first solder-hole portion (74a) of the second solder-hole row (74).

Note that solder-hole rows of the dual solder-hole layout according to the preferred embodiment of the present invention can have different shapes, for example, a curved shape. This kind of dual solder-hole layout for expansion slots also comprises a first solder-hole layout and a second solder-hole layout, each comprising a plurality of solder holes. The first solder-hole layout can be electrically connected to a first slot, while the second solder-hole layout can be electrically connected to a second slot. The first solder-hole layout comprises a first solder-hole row and a second solder-hole row. The second solder-hole layout comprises a third solder-hole row. The dual solder-hole layout can electrically connect to either the first slot or the second slot at one time.

By using the dual solder-hole layout in which solder holes in the first and second solder-hole layouts are tightly arranged, the layout space required on the circuit board can be reduced. Working together with expansion slots having different pin configuration, various types of expansion slots can share a circuit board with the same solder-hole layout.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
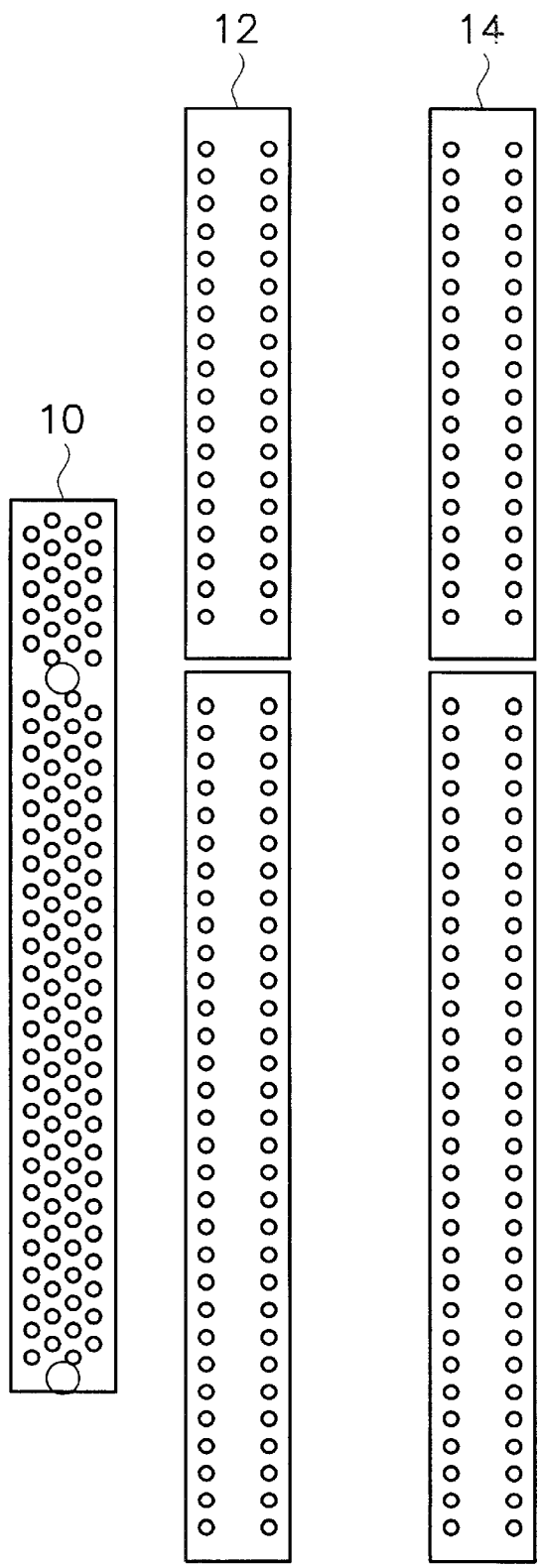
FIG. 1 is a portion of a motherboard showing a conventional solder-hole layout for expansion slots.
Figure 2:
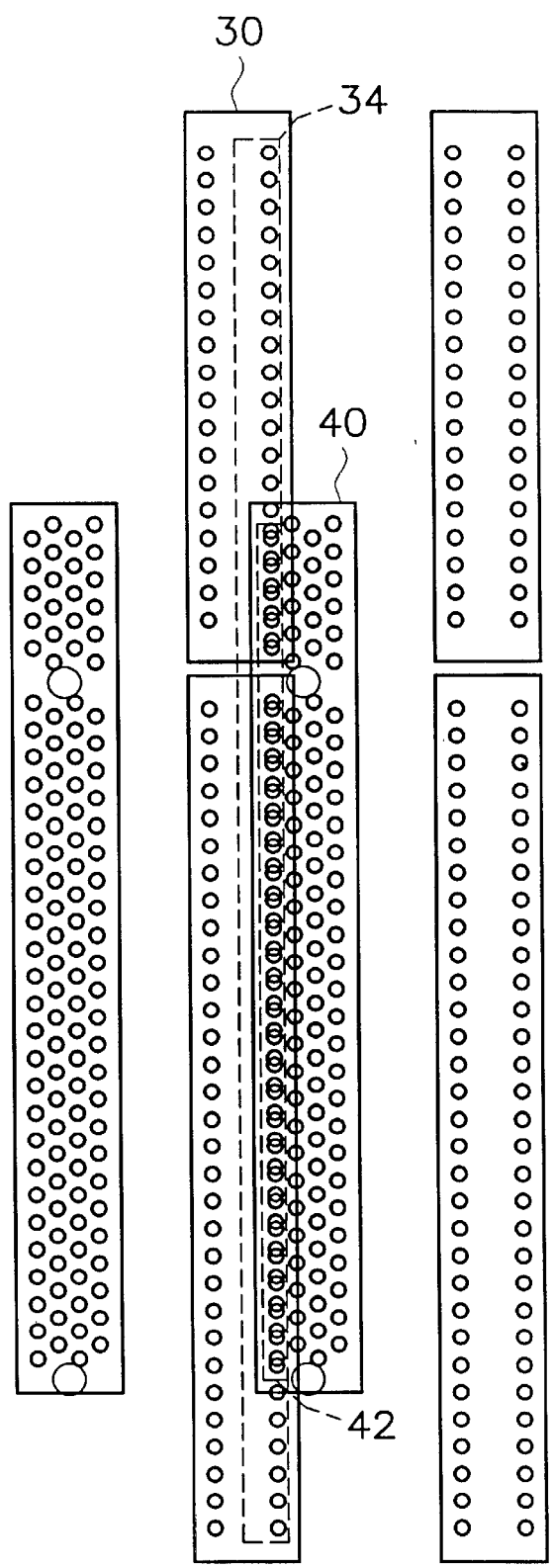
FIG. 2 is a portion of a circuit board showing a solder-hole layout for expansion slots, which causes a conflict because of the overlap of solder holes in two different solder-hole layouts.

Reference will now be made in detail to the present preferred embodiments of the invention, examples of which are illustrated in the accompanying drawings. Wherever possible, the same reference numbers are used in the drawings and the description to refer to the same or like parts.

Figure 3:
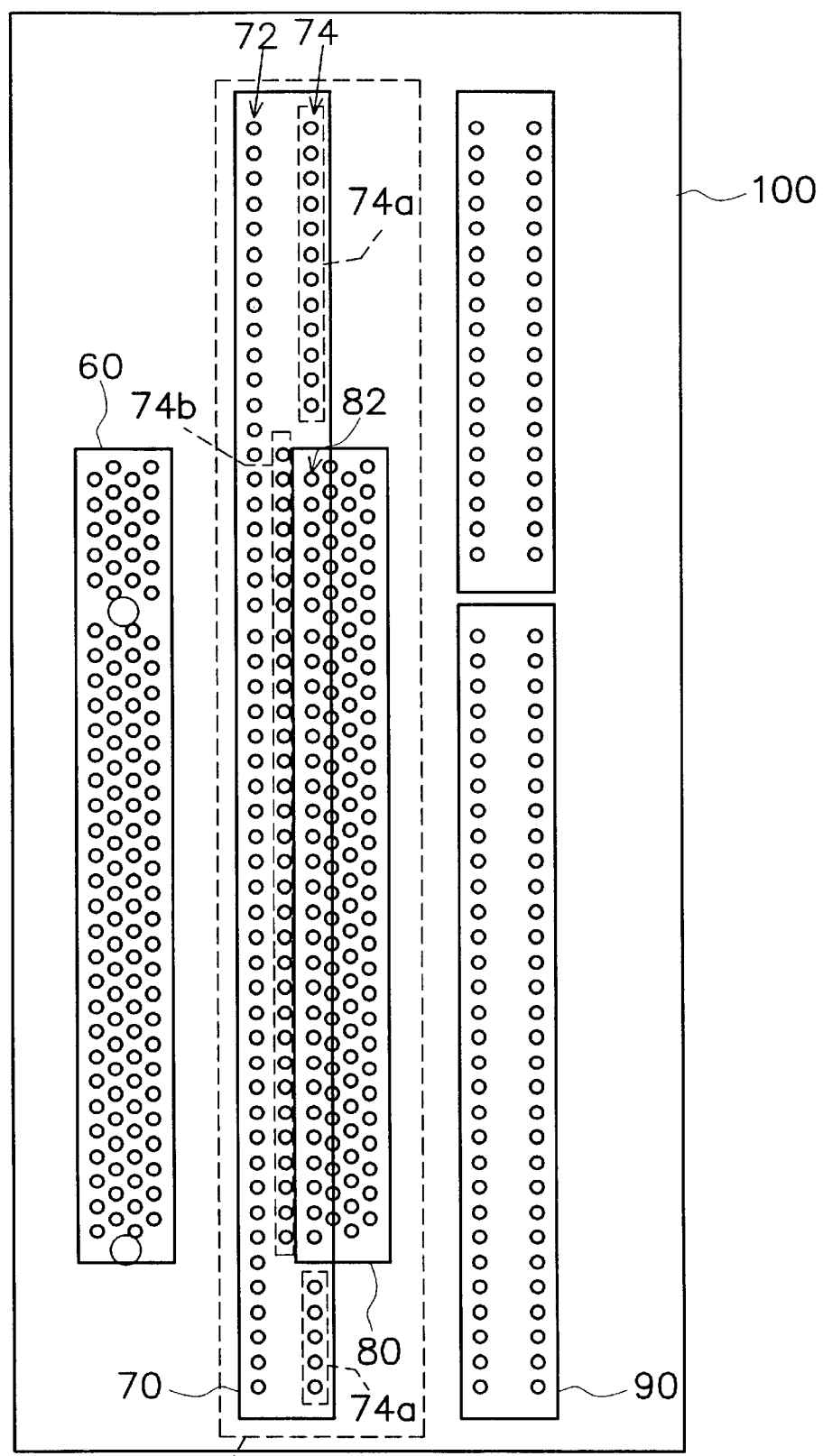
FIG. 3 is a dual solder-hole layout for expansion slots according to a preferred embodiment of the present invention.

Refer to FIG. 3, which shows a dual solder-hole layout 75 for expansion slots according to a preferred embodiment of the present invention. As shown in FIG. 3, the dual solder-hole layout 75 situated on a circuit board 100, for example, a motherboard in a computer system, comprises a first solder-hole layout 70 and a second solder-hole layout 80. There is a solder-hole layout 60 next to the solder-hole layout 70, which can be used to electrically connect to an expansion slot of the same type as that electrically connected to the solder-hole layout 80, for example, a widely used PCI slot. There is also a solder-hole layout 90 besides the solder-hole layout 80, which is used to electrically connect to an expansion slot of the same type as that electrically connected to the solder-hole layout 70, for example, an ISA slot.

In order to accommodate the first solder-hole layout 70, the second solder-hole layout 80 and the solder-hole layouts 60 and 90 in the limited space on the circuit board 100, the first solder-hole layout 70 and the second solder-hole layout 80 are tightly arranged together to form a dual solder-hole layout 75 on the circuit board 100. Depending on user's requirements, an expansion slot can be electrically affixed to the dual solder-hole layout 75.

The first solder-hole layout 70 comprises a first solder-hole row 72 and a second solder-hole row 74. The second solder-hole row 74 is separated into a first solder-hole portion 74a and a second solder-hole portion 74b as shown in FIG. 3. The second solder-hole layout 80 comprises a third solder-hole row 82. The first solder-hole row 72, the second solder-hole portion 74b, and the third solder-hole row 82 are parallel. The second solder-hole row 74 is separated into several portions so that the first solder-hole layout 70 and the second solder-hole layout 80 can be tightly put together. As shown in FIG. 3, the first solder-hole portion 74a of the second solder-hole row 74 is far from the first solder-hole row 72 while the second solder-hole portion 74b of the second solder-hole row 74 is closer to the first solder-hole row 72.

Based on the dual solder-hole layout 75, different interfacing cards can be inserted into the slots on the circuit board by using appropriate slot types without manufacturing different circuit boards according to the preferred embodiment of the present invention. What is required is to choose a desired type of expansion slot to electrically connect and affix to the dual solder-hole layout 75. For example, a PCI slot can be electrically connected to the second solder-hole layout 80 of the dual solder-hole layout 75 and affixed to the circuit board 100. On the other hand, a custom-made ISA slot can be electrically connected to the first solder-hole layout 70 of the dual solder-hole layout 75 and affixed to the circuit board 100 if the expansion equipment needs to be connected through an ISA slot. Different circuit boards are no longer required to accommodate various combinations of different slot types in different quantities to connect to expansion equipment having different interfacing requirements according the preferred embodiment of the present invention. Although custom-made ISA slots are required to match the dual solder-hole layout according to the preferred embodiment of the present invention, the manufacturing cost to make a such custom-made ISA slot is much cheaper than that of making different circuit boards. Therefore, production costs can be significantly reduced.

Figure 4:
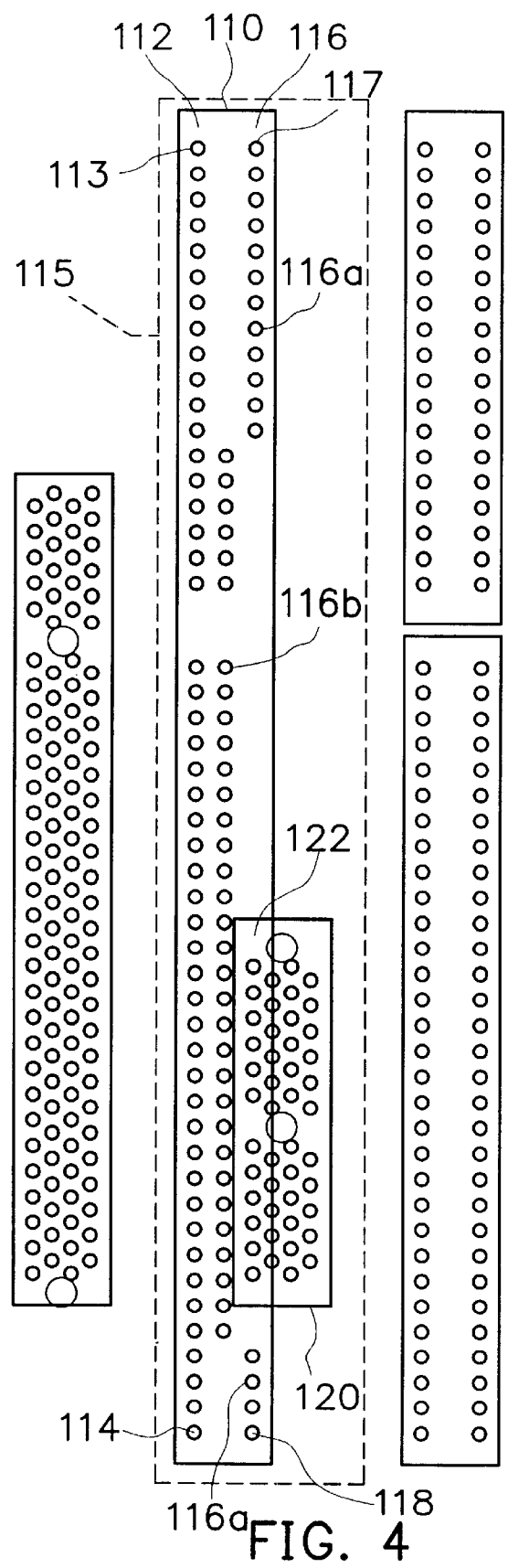
FIG. 4 is a dual solder-hole layout for expansion slots according to another preferred embodiment of the present invention.

Refer to FIG. 4, which shows a dual solder-hole layout 115 for expansion slots according to another preferred embodiment of the present invention. Note that the dual solder-hole layout 115 varies depending on actual requirements. In this preferred embodiment, a first solder-hole layout 110 comprises a first solder-hole row 112 having two end points 113 and 114 and a second solder-hole row 116 having two end points 117 and 118. The second solder-hole row 116 is separated into a first solder-hole portion 116a and a second solder-hole portion 116b. A second solder-hole layout 120 comprises a third solder-hole row 122. The first solder-hole layout 110 can be electrically connected to an ISA slot, while the second solder-hole layout 120 can be electrically connected to an audio modem riser slot according to the preferred embodiment of the present invention.

Note that the second solder-hole layout 120 comprises fewer solder holes compared with that of FIG. 3. Theoretically, it is feasible to use a second solder-hole layout 120 with a smaller second solder-hole portion 116b. However, the same second solder-hole row 116 as that of the preferred embodiment in FIG. 3 is nevertheless used because stock level for the ISA slots can be reduced.

In addition, a special expansion slot having two sockets can be adopted to electrically connect and affix to the dual solder-hole layout, so that different interfacing cards can be inserted into the special expansion slot on the circuit board through a connector port on the chassis to connect to various expansion equipment based on user's requirements.

As a summary, the dual solder-hole layout according to the preferred embodiments of the present invention has the following advantages:

1. The use of the dual solder-hole layout for expansion slots on a circuit board can solve the problem of insufficient space on the circuit board, so as to increase the compatibility for the circuit board to electrically connect to various expansion equipment.
2. The use of the dual solder-hole layout for expansion slots meets the interfacing requirements for both the mainstream products and the transitional products during the transition period.
3. The dual solder-hole layout for expansion slots can be shared by various printed circuit boards (PCB), so that stock level of the PCB can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual solder-hole layout for expansion slots having a plurality of solder holes to electrically connect to either a first slot or a second slot, the dual solder-hole layout comprising:
    a first solder-hole layout to electrically connect to the first slot, wherein the first solder-hole layout comprises a first solder-hole row and a second solder-hole row, wherein solder holes in the first solder-hole row form a straight line, and solder holes in the second solder-hole row are separated into a first solder-hole portion which is parallel to the first solder-hole row but far from the first solder-hole row and a second solder-hole portion which is parallel to the first solder-hole row and closer to the first solder-hole row; and
    a second solder-hole layout to electrically connect to the second slot, wherein the second solder-hole layout comprises a third solder-hole row which is parallel to the first solder-hole row.

2. The dual solder-hole layout for expansion slots of claim 1, wherein the first solder-hole layout is electrically connected to an industrial standard adapter (ISA) slot.

3. The dual solder-hole layout for expansion slots of claim 1, wherein the second solder-hole layout is electrically connected to a peripheral component interconnect (PCI) slot.

4. The dual solder-hole layout for expansion slots of claim 1, wherein the second solder-hole layout is electrically connected to an audio modem riser slot.

5. A dual solder-hole layout for expansion slots having a plurality of solder holes on a circuit board to electrically connect to either a first slot or a second slot, the dual solder-hole layout comprising:
    a first solder-hole layout to electrically connect to the first slot, wherein the first solder-hole layout comprises a first solder-hole row and a second solder-hole row, and solder holes in the second solder-hole row form a curved shape; and
    a second solder-hole layout to electrically connect to the second slot.

6. The dual solder-hole layout for expansion slots of claim 5, wherein the first solder-hole layout is electrically connected to an industrial standard adapter (ISA) slot.

7. The dual solder-hole layout for expansion slots of claim 5, wherein the second solder-hole layout is electrically connected to a peripheral component interconnect (PCI) slot.

8. The dual solder-hole layout for expansion slots of claim 5, wherein the second solder-hole layout is electrically connected to an audio modem riser slot.

9. The dual solder-hole layout for expansion slots of claim 5, wherein the circuit board is a computer motherboard.

10. A dual solder-hole layout for expansion slots having a plurality of solder holes, the dual solder-hole layout comprising:
    a first solder-hole layout to electrically connect to a first slot, wherein the first solder-hole layout comprises a first solder-hole row and a second solder-hole row; and
    a second solder-hole layout to electrically connect to a second slot, wherein the second solder-hole layout comprises a third solder-hole row,
wherein the first solder-hole layout comprises a solder-hole region which is encircled by consecutively connecting two end points of the first solder-hole row and two end points of the second solder-hole row, wherein the first region covers a portion of the third solder-hole row.

11. The dual solder-hole layout for expansion slots of claim 10, wherein the first solder-hole layout is electrically connected to an industrial standard adapter (ISA) slot.

12. The dual solder-hole layout of a slot of claim 10, wherein the second solder-hole layout is electrically connected to a peripheral component interconnect (PCI) slot.

13. The dual solder-hole layout for expansion slots of claim 10, wherein the second solder-hole layout is electrically connected to an audio modem riser slot.

* * * * *